US006391670B1

(12) United States Patent
Wells et al.

(10) Patent No.: US 6,391,670 B1
(45) Date of Patent: May 21, 2002

(54) METHOD OF FORMING A SELF-ALIGNED FIELD EXTRACTION GRID

(75) Inventors: David H. Wells, Boise, ID (US); Ji Ung Lee, Cohoes, NY (US); Aaron R. Wilson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/303,091

(22) Filed: Apr. 29, 1999

(51) Int. Cl.[7] .................................................. H01L 21/00

(52) U.S. Cl. ............................ 438/20; 445/49; 445/50; 445/51

(58) Field of Search ............................ 438/20; 445/49, 445/50, 51

(56) References Cited

U.S. PATENT DOCUMENTS 5,229,331 A * 7/1993 Doan et al. ................. 437/228
5,394,006 A * 2/1995 Liu ............................ 257/506
5,536,193 A * 7/1996 Kumar ........................ 445/50

* cited by examiner

*Primary Examiner*—John F. Niebling
*Assistant Examiner*—David A. Zarneke
(74) *Attorney, Agent, or Firm*—Fogg, Slifer, Polglaze, Leffert & Jay, P. A.

(57) ABSTRACT

A method of forming an extraction grid for field emitter tip structures is described. A conductive layer is deposited over an insulative layer formed over the field emitter tip structures. The conductive layer is milled using ion milling. Owing to topographical differences along an exposed surface of the conductive layer, ions strike the exposed surface at various angles of incidence. As etch rate from ion milling is dependent at least in part upon angle of incidence, a selectivity based on varying topography of the exposed surface ("topographic selectivity") results in non-uniform removal of material thereof. In particular, portions of the conductive layer in near proximity to the field emitter tip structures are removed faster than portions of the conductive layer between emitter tip structures. Thus, portions of the insulative layer in near proximity to the field emitter tip structures may be exposed while leaving intervening portions of the conductive layer for forming the extraction grid. Accordingly, such formation of the extraction grid is self-aligned to its associated emitter tip structures.

20 Claims, 6 Drawing Sheets

METHOD OF FORMING A SELF-ALIGNED FIELD EXTRACTION GRID

STATEMENT AS TO RIGHTS TO INVENTIONS MADE UNDER FEDERALLY-SPONSORED AND DEVELOPMENT

This invention was made with government support under Contract No. DABT63-97-C-0001 awarded by the Defense Advanced Research Projects Agency (DARPA). The government has certain rights in this invention.

FIELD OF THE INVENTION

The present invention relates generally to grids and their formation, and more particularly to field extraction grids and their construction for field emission displays.

BACKGROUND OF THE INVENTION

In the microelectronics industry, there is a movement toward creating flat panel displays. These displays have the advantage of being significantly more compact than cathode ray tube displays, e.g., conventional computer monitors. There are different types of flat panel displays, such as liquid crystal displays ("LCDs"), gas-plasma displays, thin film transistor ("TFT") displays, and field emission displays ("FEDs"). FEDs are particularly well suited to applications requiring high resolution, low power demand, wide viewing angle, and physical robustness in an operational environment.

FEDs are able to achieve high resolution owing in part to the presence of a significant number of emitter tip structures concentrated in a small space. These emitter tip structures, or cold cathode field emitter tip structures, and their formation are described in U.S. Pat. Nos. 5,391,259, 5,372,973, 5,358,908, 5,151,061, 3,755,704, 3,665,241, among others.

For emitter tip structures to emit electrons, a voltage bias is applied across the emitter tip structures and an extraction grid to create a potential difference therebetween. In U.S. Pat. No. 5,372,973 to Doan et al., formation of an extraction grid self-aligned to emitter tip structures is described.

In Doan et al., after forming emitter tip structures, a silicon nitride layer is deposited over the emitter tip structures. This layer is conformal to the surface upon which it is deposited. Next, boro-phospho-silicate-glass ("BPSG") is deposited as an insulating layer. The BPSG layer is deposited and re-flowed, such that it does not extend above the silicon nitride layer. In other words, the silicon nitride layer above the emitter tip structures is left exposed after deposition and re-flowing of the BPSG. Next, a conductive layer, such as a layer of polysilicon having impurities ("dopants"), is deposited on the BPSG layer and the exposed regions of the silicon nitride layer. The layer of polysilicon is chemically-mechanically polished to re-expose regions of the silicon nitride layer; specifically, those regions disposed above apexes of the emitter tip structures. Accordingly, the polished conductive layer of polysilicon forms an extraction grid self-aligned to the emitter tips. The assembly may then be etched to pull the silicon nitride and the BPSG away from the emitter tip structures.

Though Doan et al. provide a self-aligned process for forming an extraction grid after formation of emitter tip structures, Doan et al. exposes the extraction grid layer to water, chemical-mechanical-polishing (CMP) slurry, and other potentially corrosive materials, some of which must then be cleaned off the assembly with other materials which may be harmful to some emitter structures.

A technique known as "etch back" is an alternative to CMP in situations where a blanket flow fill layer is previously deposited. Etch-back typically refers to a blanket plasma ("dry") etch of such a surface. Etch-back does not have the above-mentioned disadvantages of CMP. However, etch-back uniformly removes material across a surface. Referring to U.S. Pat. No. 5,266,530 to Bagley, et al. ("Bagley"), dielectric layer 24 is etched back to expose a portion of underlying dielectric layer 22. Dielectric layer 22 may then be etched to pull it away from tip 18. Gate layer 26 may then be deposited, and subsequently etched to remove a portion of gate layer 26 deposited on tip 18. In Bagley, uniform removal by etching is employed. However, it would be desirable to define a gate layer with fewer etching steps than Bagley.

Accordingly, it would be desirable in the art of manufacturing field emission devices to provide a self-aligned process for forming an extraction grid after forming emitter tip structures with the advantages associated with dry etch with conformal or substantially conformal (with plus or minus 50 nm) deposit material using fewer etch steps than in Bagley.

SUMMARY OF THE INVENTION

The present invention provides a method for forming a grid. In particular, a substrate assembly having one or more emitter tip structures formed thereon or therefrom is provided. An insulative layer is formed on or above the emitter tip structures, as well as on or above an associated emitter layer from which the emitter tip structures protrude. A conductive layer is formed on or above the insulative layer. An exposed surface of the conductive layer thus exhibits topographical variation owing to the presence of the underlying emitter tip structures. The exposed surface is then subjected to particle bombardment from ion milling. These particles are used to remove material from the conductive layer at various etch rates dependent at least in part on angle of incidence thereof. More particularly, portions of the conductive layer in near proximity to the one or more emitter tip structures are removed more rapidly than other portions. Accordingly, the insulative layer may be exposed in near proximity to the one or more emitter tip structures, while leaving a surrounding portion of the conductive layer for forming the grid.

In accordance with the present invention, a grid structure may be formed. Such a grid may be used as an anode in a field emitter display device for extracting electrons from emitter tip structures, namely, as an "extraction grid." Such an "extraction grid" may be formed self-aligned or centered to one or more of the emitter tip structures due to the preferential etching of the conductive layer overlying the emitter tip structure locations. In other words, the extraction grid or portions thereof may have z-axis (an axis traveling up through the center of an emitter tip structure) symmetry with respect to one or more associated emitter tip structures. Stated another way, a portion of the extraction grid in near proximity to an associated emitter tip structure is centered relative to said structure. Owing to performance characteristics dependent upon alignment of an emitter tip structure and its corresponding anode extraction grid section, as well as ease of manufacture, a self-aligned process for forming such an extraction grid is advantageous. Moreover, an extraction grid in accordance with the present invention may be formed in-situ with respect to other portions of the field emission display. Furthermore, ion milling may be used to expose the one or more emitter tip structures for sharpening. Such sharpening may be done in-situ with the ion milling used to expose the emitter tip structures.

BRIEF DESCRIPTION OF THE DRAWINGS

Features and advantages of the present invention will become more apparent from the following description of the preferred embodiments described below in detail with reference to the accompanying drawings where.

Figure 1:
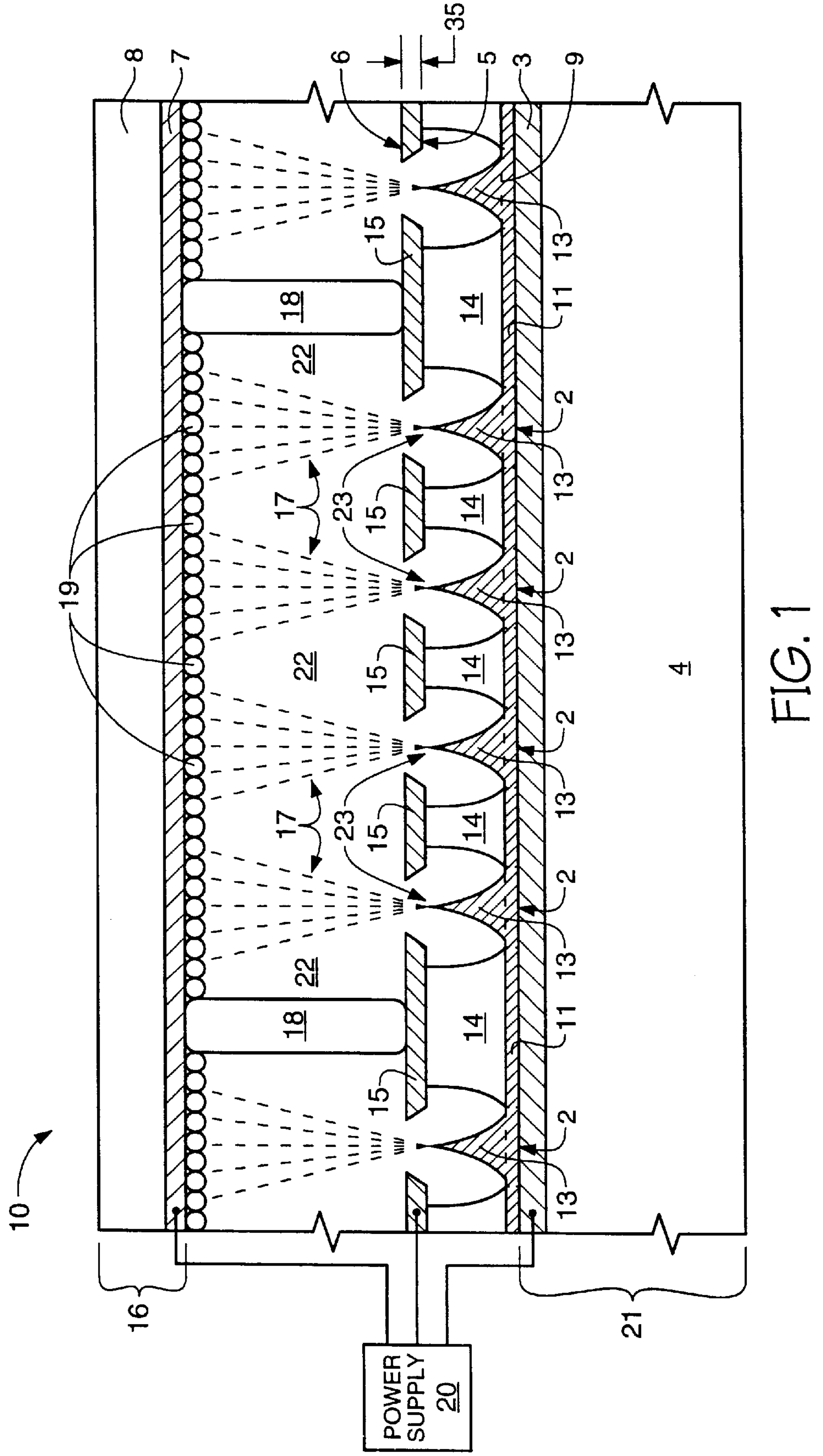
FIGS. 1, 2 and 3 are cross-sectional views of exemplary portions of embodiments of FEDs formed in accordance with the present invention.

Reference numbers refer to the same or equivalent parts of embodiment(s) of the present invention throughout the several figures of the drawing.

DETAILED DESCRIPTION OF THE PREFERRED EMBODIMENTS

In the following detailed description of the preferred embodiments, reference is made to the accompanying drawings which form a part of this disclosure, and which, by way of illustration, are provided for facilitating understanding of specific embodiments in accordance with the present invention described herein. Though the present invention is described in terms of the formation of a portion of an FED, it is to be understood that other embodiments may be practiced without departing from the scope of the present invention. To more clearly describe the present invention, some conventional details with respect to FEDs and systems including an FED have been omitted.

Figure 2:
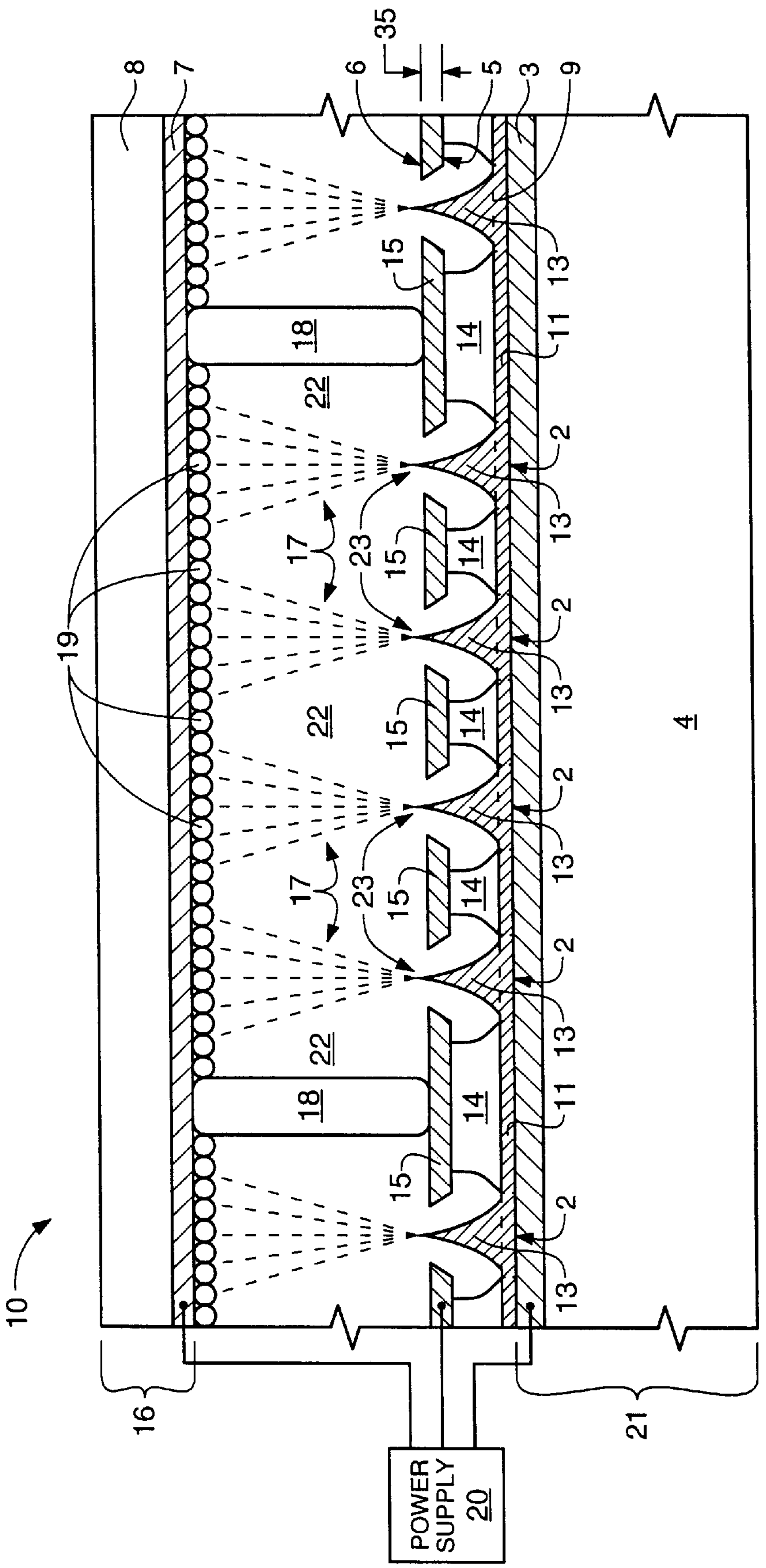
Figure 3:
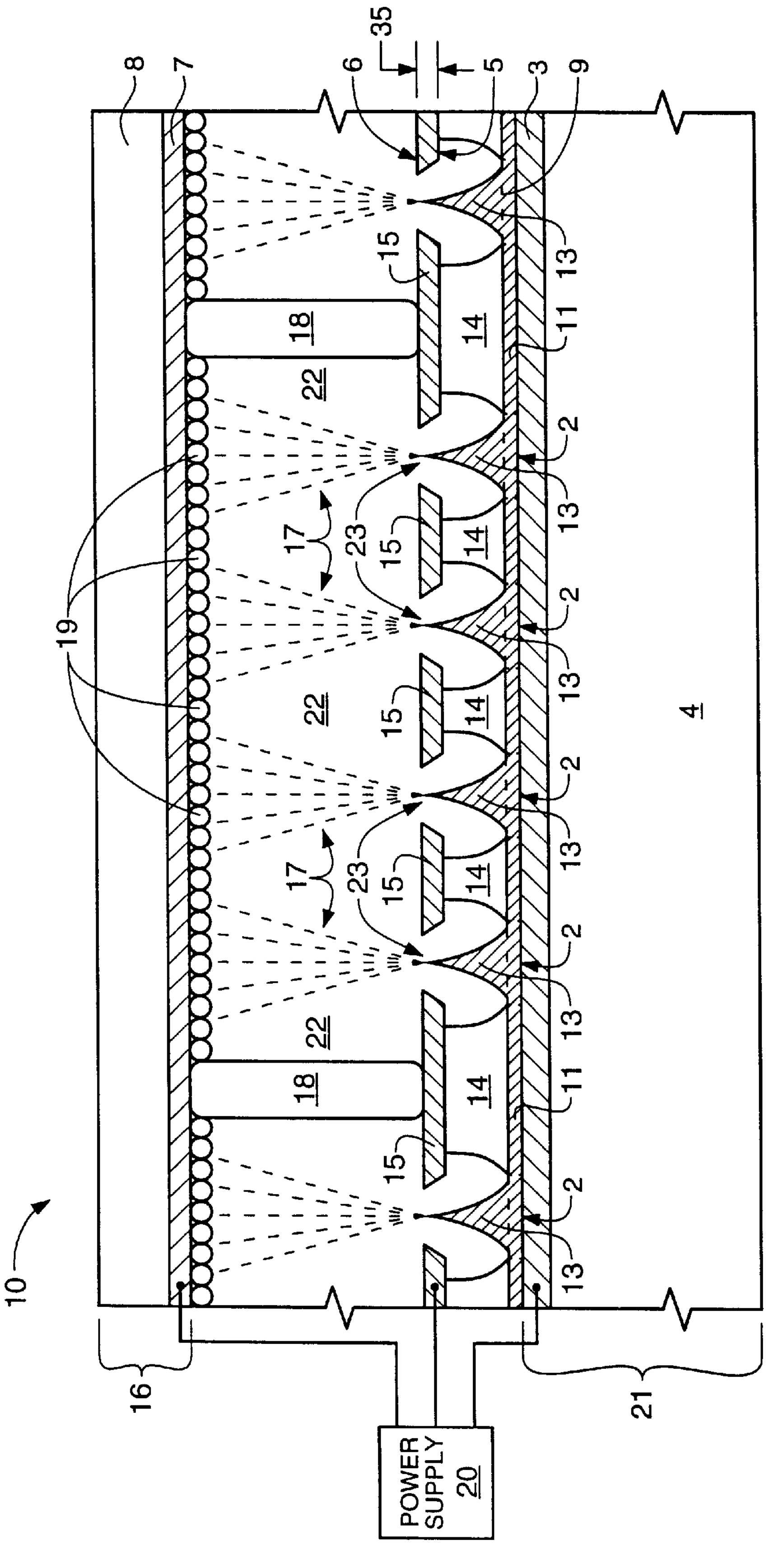

Referring to FIGS. 1, 2 and 3, there are shown cross-sectional views of exemplary portions of embodiments of FED 10 as may be formed through use of the present invention. FED 10 comprises a lower member ("baseplate") 21. Baseplate 21 conventionally comprises an electrically insulative body 4, such as glass, and an electrically conductive body 3. Conductive body 3 may be patterned to form a grid.

Emitter layer 11 extends over conductive body 3, and is in electrical contact with conductive body 3. Emitter or resistive layer 11 is electrically conductive and provides a sufficient amount of electrical resistance. Electrically resistive pads 2 of a different electrical resistance than resistive layer 11 may optionally be formed over conductive body 3 in substantial vertical orientation below emitter tip structures 13, or resistive layer 11 and resistive pads 2 may be formed as a single unit. Power supply 20 is electrically coupled to resistive layer 11 through conductive body 3. Resistive layer 11 comprises emitter tip structures 13. Emitter tip structures 13 may be integrally formed as a part of resistive layer 11, or may be formed from one or more separate layers as illustratively indicated by dashed line 9. Resistive layer 11 may be made of one or more electrically conductive materials, such as one or more metals or conductively adjusted semiconductors.

Spacer 14 extends over resistive layer 11. Spacer 14 may be made of one or more electrically insulative materials, such as one or more dielectrics, as illustratively shown in FIGS. 4 and 5 with respect to insulative layer 24. More particularly, spacer 14 may comprise one or more layers of one or more dielectric materials, such as an oxide, a nitride, or like dielectric material.

Extraction grid 15 extends over spacer 14. Extraction grid 15 may be made of one or more electrically conductive materials, such as one or more metals or conductively adjusted semiconductors. By conductively adjusted, it is meant that acceptor and/or donor impurities or defects are intentionally added to a semiconductor to adjust its conductivity.

FED 10 further comprises posts 18 and upper member 16 ("faceplate"). Posts 18 aid in defining and maintaining volume 22 between faceplate 16 and emitter tip structures 13. Volume 22 may be completely or substantially evacuated to further facilitate electron 20 projection 17 from emitter tip structures 13 to phosphors 19 of faceplate 16. Faceplate 16 may comprise a non-opaque glass 8 having a non-opaque electrically conductive body 7 laminated thereto. Conductive body 7 is conventionally formed of indium tin oxide ("ITO").

Power supply 20 is electrically coupled to resistive layer 1 1, extraction grid 15 and faceplate 16. Extraction grid 15 is biased by power supply 20 to be more positive in voltage than resistive layer 11. By creating a potential difference between emitter tip structures 13 and extraction grid 15, electrons are ejected or projected from emitter tip structures 13. To attract and accelerate electrons 17 from emitter tip structures 13 to phosphors 19, a positive voltage is applied to conductive body 7 of faceplate 16. As voltage applied to conductive body 7 of faceplate 16 is more positive than that applied to extraction grid 15, a difference in potential between extraction grid 15 and faceplate 16 exists which facilitates electron attraction.

The present invention provides the ability to form extraction grid 15 at different locations with respect to apexes 23 of emitter tip structures 13. Extraction grid 15 may be formed above apexes 23, as illustratively shown in FIG. 1. Alternatively, extraction grid 15 may be formed below apexes 23, as illustratively shown in FIG. 2. Alternatively, a portion of extraction grid 15 may be formed coplanar with apexes 23, as illustratively shown in FIG. 3 with respect to thickness 35 including but not limited to upper surface 6 and lower surface 5 of extraction grid 15. Moreover, it should be understood from the following detailed description that extraction grid 15 or portions thereof may be formed self-aligned to one or more associated emitter tip structures 13.

Figure 4:
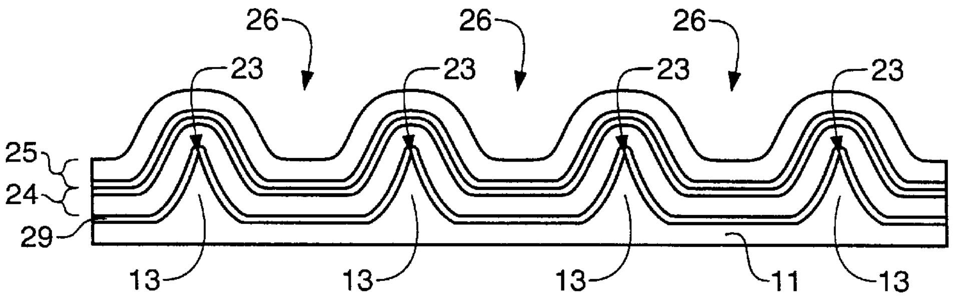
FIGS. 4 and 5 are cross-sectional views of exemplary portions of embodiments of in-process substrate assemblies in accordance with the present invention.
Figure 5:
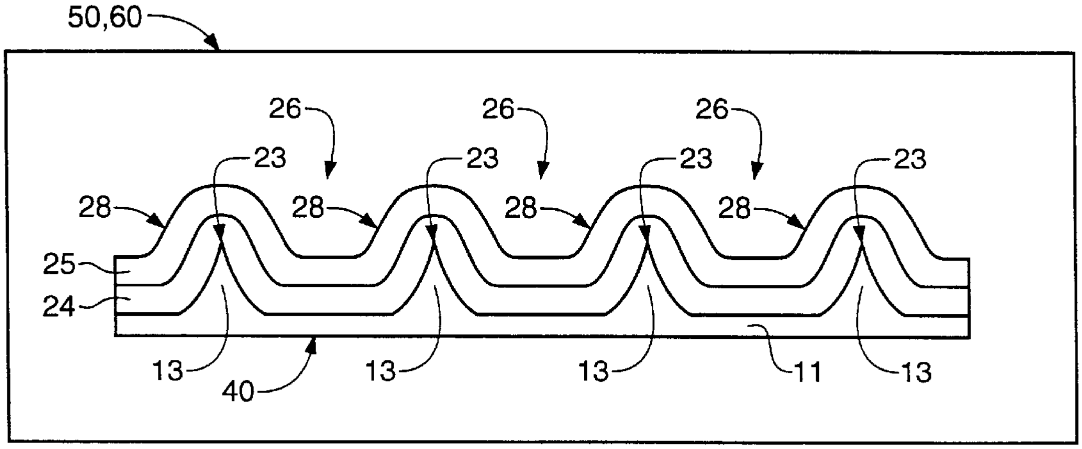

Referring to FIGS. 4 and 5, there are shown cross-sectional views of exemplary portions of respective embodiments of in-process FEDs 10 in accordance with the present invention. Notably, in each embodiment emitter tip structures 13 are formed prior to forming extraction grid 15.

Insulative layer 24 is formed adjacent resistive layer 11. By adjacent it is meant that insulative layer 24 is in near proximity to resistive layer 11 and may or may not be in contact with resistive layer 11. As illustratively shown in FIG. 4, an intervening layer 29 may exist between insulative layer 24 and resistive layer 11. Layer 29 may be deposited on resistive layer 11, may be grown from resistive layer 11, or may be formed by the interaction of insulative layer 24 and resistive layer 11.

Though insulative layer 24 is shown as conformal or substantially conformal to resistive layer 11, it need not be. By way of example and not limitation, owing to the contour created by emitter tip structures 13, insulative layer 24 may be thinner over an upper portion of emitter tip structures 13 as compared to its thickness in valley 26 between emitter tip structures 13. Moreover, insulative layer may be deposited and ion milled as described in U.S. Patent Application entitled "Structure and Method for Reduced Emitter Tip to Gate Space in Field Emission Devices", filed Sep. 2, 1998, to Ji Ung Lee and incorporated by reference as though fully set forth herein. In the preferred embodiment, insulative layer 24 is a single layer of a silicon oxide formed by with a low temperature process such as plasma enhanced chemical vapor deposition ("PECVD") or physical vapor deposition ("PVD"), as illustratively shown in FIG. 5.

Conductive layer 25 is formed adjacent to insulative layer 24. By adjacent it is meant that conductive layer 25 is in near proximity to insulative layer 24 and may or may not be in contact with insulative layer 24. Conductive layer 25 is illustratively shown as being in contact with insulative layer 24. However, conductive layer 25 need not be in contact with insulative layer 24. By way of example and not limitation, one or more intermediate layers (not shown) may be formed between conductive layer 25 and insulative layer 24. Intermediate layers may be formed by deposition, growth, or material interaction. The latter type of formation depends at least in part on the materials employed, and such formation includes but is not limited to a silicide, a silicon nitride, a metal oxide, and like combination.

Conductive layer 25 comprises one or more layers formed of one or more conductive materials as illustratively shown in FIGS. 4 and 5. In the preferred embodiment, conductive layer 25 is vapor deposited to provide a single layer of amorphous silicon with phosphorous impurities, as illustratively shown in FIG. 5. Conductive layer 25 need not be conformal as illustratively shown in FIGS. 4 and 5, and preferably it is thinner in near proximity to apexes 23 of emitter tip structures 13 as compared with its thickness in valley 26. For use of deposited silicon, this thinning may be achieved by adjusting deposition parameters to adjust flow characteristics of the silicon.

Figure 6:
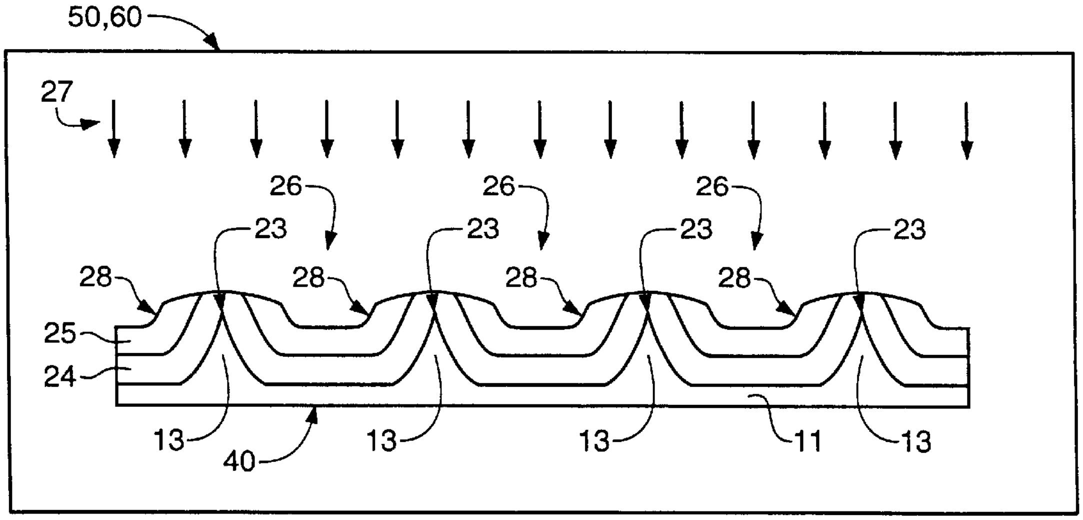
FIG. 6 is a cross-sectional view of the substrate assembly of FIG. 5 during ion milling in accordance with the present invention.

After formation of conductive layer 25, extraction grid 15 is formed by ion milling, as illustratively shown in FIG. 6 with respect to particles 27. With respect to ion milling, an inert or reactive gas environment may be used. By way of example and not limitation, ionized argon (Ar) gas with voltages at or in excess of 100 volts are used in an embodiment for ion milling. Ion milling may be described as ion bombardment of a surface do to effect removal of material therefrom by momentum transfer.

By way of example and not limitation, an inductively coupled plasma (ICP) source of a dry or plasma etch tool, such as a Continuum tool from Lam Research Corp. of Fremont, California, with a top and a bottom electrode (dual power chamber) may be used for ion milling. In the Continuum tool, the top and bottom electrodes are not coupled. The top electrode is used to provide a plasma source ("top power"), and the bottom electrode is used to provide a bias voltage ("bottom power") and a wafer chuck. In the Continuum tool, the bias power is provided as a radio frequency (RF) signal to the bottom electrode. By increasing power of the RF signal, bias voltage increases as applied to the substrate assembly positioned on the bottom electrode. In one embodiment of the present invention, a top electrode power is set at about 2500 Watts (W); a bottom electrode power is set in a range of about 400 to 800 W over a substrate assembly of about 250 by 300 millimeters (about 10 by 12 inches) wide; a gas pressure is set at about $13.16\times10^{-6}$ atm (about 10 mTorr); and an argon (Ar) gas flow rate is set at about 200 sccm (standard cubic centimeters per minute; a standard cubic centimeter of gas is conventionally determined at about room temperature at about one atmosphere of pressure).

Figure 7:
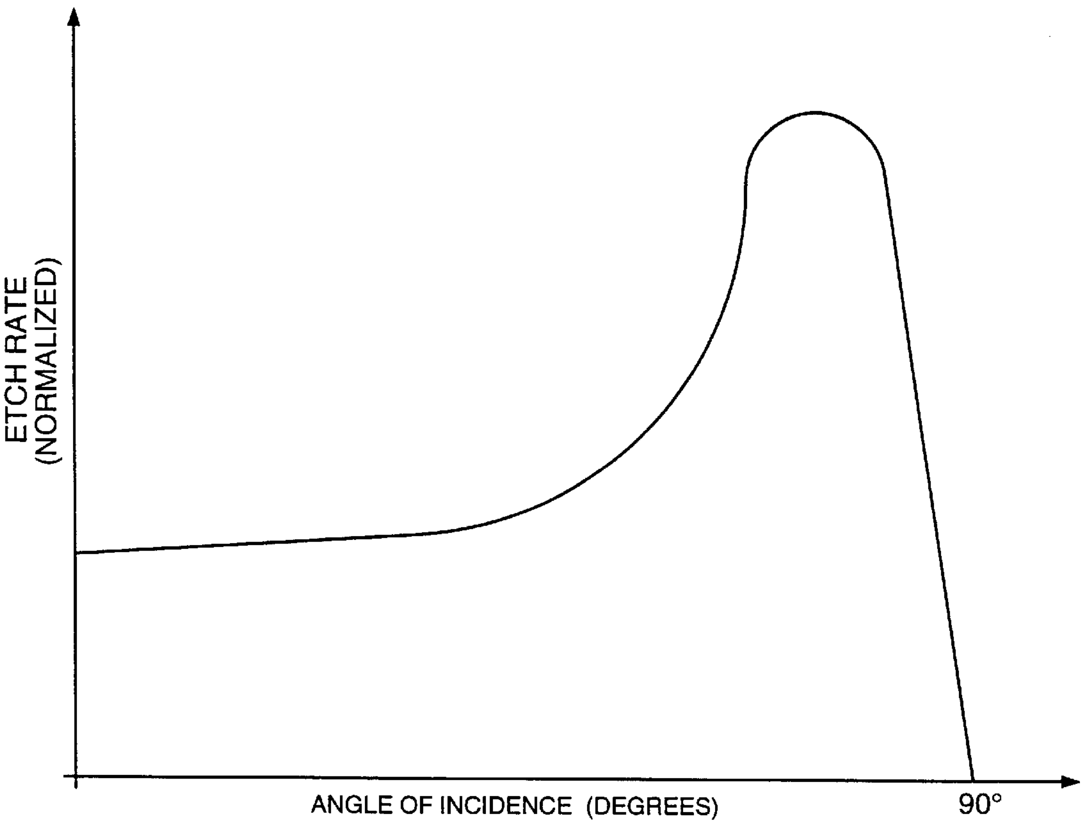
FIG. 7 is a graphical representation of angle of incidence versus etch rate for ion milling in accordance with the present invention.

Owing to topographical differences or variations along surface 28 of conductive layer 25 substantially corresponding to locations of underlying emitter tip structures, there is a distribution of angles of incidence, $\alpha$, of particles 27 impacting on surface 28. Angle of incidence, $\alpha$, is defined as angular deviation from normal or perpendicular incidence to a tangential line through a point location at which a particle strikes a surface. Etch rate is dependent at least in part on angle of incidence, $\alpha$, as illustratively shown in a graph of angle of incidence (x-axis) versus etch rate (y-axis) of FIG. 7. FIG. 7 indicates that as the angle of incidence increases from 0 degrees toward 90 degrees, etch rate increases. However, just prior to parallel incidence, etch rate dramatically decreases.

In accordance with an embodiment of the present invention, particles 27 are directed or projected in a range from substantially perpendicular to perpendicular with respect to substrate assembly 40. By substrate assembly, it is meant a base member having one or more layers of material formed thereon.

Particles 27 impact along surface 28 at a variety of angles of incidence. In valley regions 26, angles of incidence, $\alpha$, may range from approximately 0 to 45 degrees inclusive. Along slopes of surface 28 approaching underlying emitter tip structures 13, angles of incidence, $\alpha$, may range from approximately 45 to 85 degrees non-inclusive. Along surface 28 disposed above apexes 23, angles of incidence, $\alpha$, may range from approximately 85 to 90 degrees inclusive. In the above-described embodiment, etch rate for angle of incidence, $\alpha$, in a range of approximately 0 to 45 degrees is lower than if it were in a range of approximately 45 to 85 degrees. Accordingly, it should be understood that etch rate is dependent on angle of incidence. This phenomenon also ensures that an extraction grid 15 formed from conductive layer 25 is self-aligned to locations of emitter tip structures 13, since the portions of conductive layer 25 underlying emitter tip structure 13 are etched most rapidly. Moreover, it should be understood that topography of surface 28 may be tailored to enhance this non-uniform material removal from conductive layer 25. By way of example and not limitation, geometry of emitter tip structures 13 may be altered to affect angle of incidence in order to effect a change in etch rate.

After milling, portions of another layer underlying conductive layer 25 may be exposed. In the preferred embodiment, portions of insulative layer 24 are exposed as illustratively shown in FIG. 6. The portion of conductive layer 25 remaining after milling forms extraction grid 15 (shown in FIGS. 1, 2, or 3).

After milling conductive layer 25, insulative layer 24 surrounding emitter tip structures 13 may be etched with a plasma ("dry") or chemical bath ("wet") process. In the preferred embodiment, a wet etch is used, as illustratively shown in the cross-sectional view of FIG. 8. Extraction grid 15 may be patterned prior to etching layer 24 so that address lines for extraction grid 15 may be formed.

Figure 8:
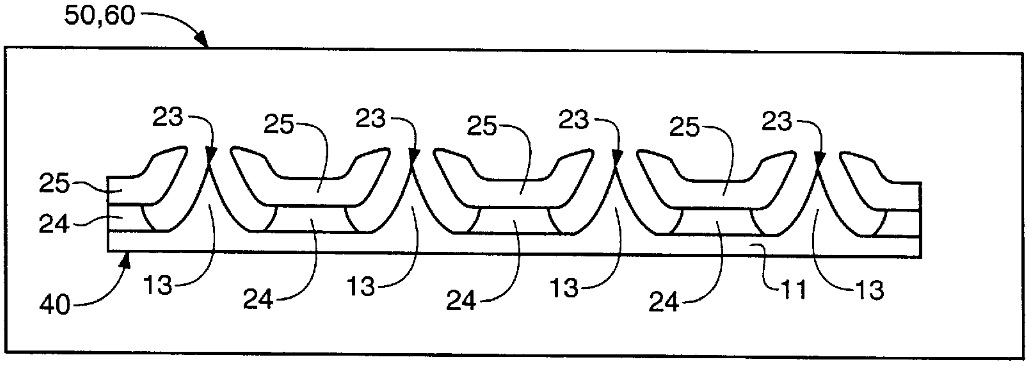
FIG. 8 is a cross-sectional view of the substrate assembly of FIG. 6 after isotropic etching.

Layers 24 and 25, as illustratively shown in FIGS. 5, 6 and 8, may be formed in situ in accordance with the present invention. By in-situ it is meant that all steps may be performed in chamber 50 or a cluster 60 without having to unseal the chamber or the cluster, respectively. By cluster it is meant a plurality of chambers operatively coupled such that vacuum need not be broken when moving a substrate assembly from one chamber to another. Thus, substrate 40 may be placed in chamber 50 or cluster 60 after forming emitter tip structures 13 and prior to forming insulative layer 24. Chamber 50 or cluster 60 may then be sealed, and layers 24 and 25 may be formed prior to unsealing chamber 50 or cluster 60, respectively.

In a single chamber embodiment, chamber 50 may be a deposition and etch chamber, such as a sputter deposition and etch chamber. In a clustered chambers embodiment, a PECVD or PVD chamber may be used for forming insulative layer 24 and conductive layer 25, and an etch chamber, such as a "Continuum" tool from Lam Research of Freemont, California, may be used for topographically selectively removing material from conductive layer 25, and may be used for isotropically dry etching insulative layer 24.

Figure 9:
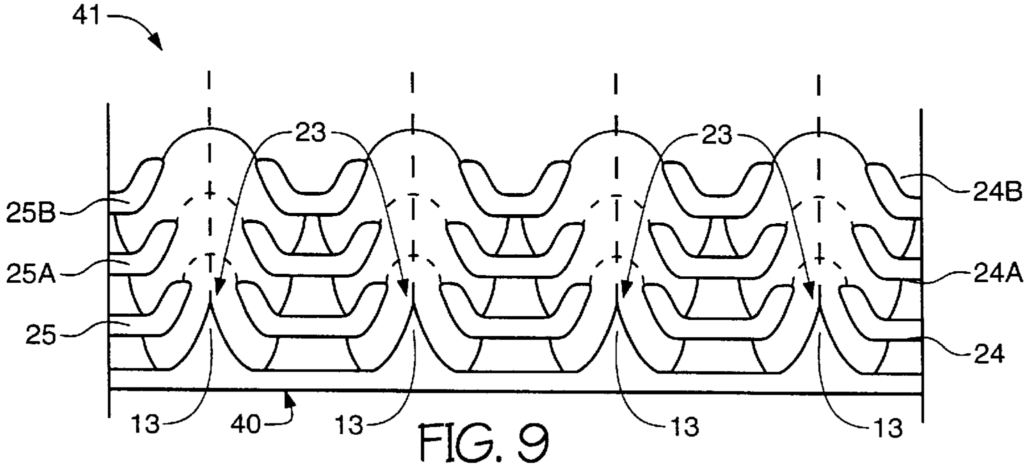
FIG. 9 is a cross-sectional view of an exemplary portion of pentode formed in accordance with the present invention.

Referring to FIG. 9, there is shown a cross-sectional view of an exemplary portion of pentode 41 in accordance with the present invention. Pentode 41 may be used in a cathode ray tube (CRT) electron gun or in an FED. Pentode 41 comprises a control grid formed by conductive layers 25, 25A, and 25B, each of which provide a separate anode or grid element. In forming pentode 41, insulative layers 24, 24A and 24B, and conductive layers 25, 25A, and 25B are formed self-alignment to emitter tip structures 13.

Insulative layers 24, 24A, and 24B may be formed such that each layer is either progressively thinner or thicker than an associated preceding layer. If insulative layers 24, 24A, and 24B are formed progressively thinner or thicker, then conductive layers 25, 25A, and 25B may be disposed progressively closer or further, respectively, to or from vertical axis 45 through apexes 23 of emitter tip structures 13.

Figure 10:
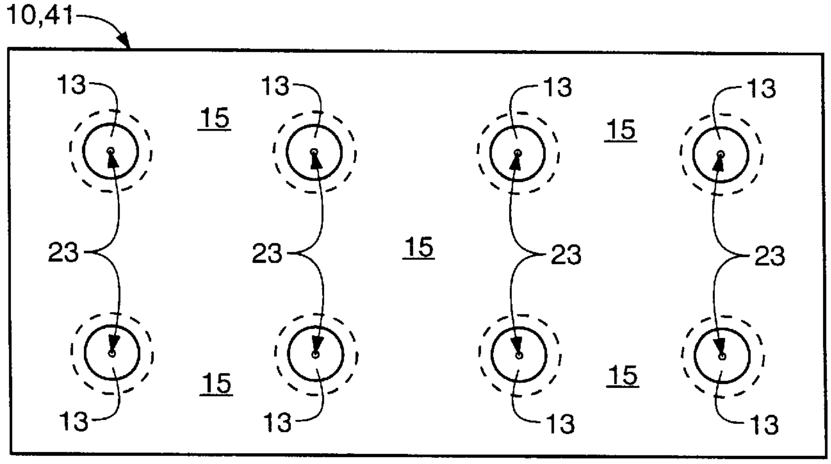
FIG. 10 is a top down view of an exemplary portion of an embodiment of an extraction grid formed in accordance with the present invention.

Referring to FIG. 10, there is shown a top-down view of an exemplary portion of an embodiment of an extraction grid 15 formed in accordance with the present invention.

The present invention has been particularly shown and described with respect to certain preferred embodiment(s) and features thereof. It should be readily apparent to those of ordinary skill in the art that various changes and modifications in form and detail may be made without departing from the spirit and scope of the present invention as set forth in the appended claims.

What is claimed is:

1. A self-aligned process for providing an extraction grid, comprising:

providing a substantially planar substrate assembly including a plurality of emitter tip structures thereon, said plurality of emitter tip structures defining at least one valley therebetween;

forming an insulative layer adjacent said plurality of emitter tip structures and in said at least one valley;

forming a conductive layer adjacent said insulative layer, said conductive layer having a surface with topographical variation corresponding at least in part to locations of said emitter tip structures of said plurality; and selectively removing material from said conductive layer by ion milling responsive to said topographical variation to expose portions of said insulative layer in near proximity to apexes of said emitter tip structures while leaving material of said conductive layer over said at least one valley.

2. The self-aligned process of claim 1, wherein said ion milling directs ions substantially perpendicular to the plane of said substrate assembly.

3. The self-aligned process of claim 1, wherein said ion milling directs ions perpendicular to the plane of said substrate assembly.

4. The self-aligned process of claim 1, further comprising exposing portions of said emitter tip structures at and in near proximity to said apexes using said ion milling.

5. A self-aligned process for providing an extraction grid, comprising:

providing a substantial planar substrate assembly including a plurality of emitter tip structures thereon, said emitter tip structures defining at least one valley therebetween;

forming an insulative layer adjacent said emitter tip structures and in said at least one valley;

forming a conductive layer adjacent said insulative layer, said conductive layer having a surface with topographical variation substantially corresponding to locations of said emitter tip structures; and selectively removing material from said conductive layer responsive to said topographical variation to expose portions of said insulative layer in near proximity to apexes of said emitter tip structures while leaving material of said conductive layer over said at least one valley, said selective removal comprising:

ion milling said conductive layer at varying rates at least partially responsive to angles of incidence of ions to said conductive layer.

6. The self-aligned process of claim 5, wherein said ion milling directs ions substantially perpendicular to the plane of said substrate assembly.

7. The self-aligned process of claim 5, wherein said ion milling directs ions perpendicular to the plane of said substrate assembly.

8. The self-aligned process of claim 5, further comprising exposing portions of said emitter tip structures at and in near proximity to said apexes using said ion milling.

9. A method for forming an extraction grid, comprising:

providing a substrate assembly including at least one emitter tip structure thereon;

forming an insulative layer of one or more layers or more dielectric materials on or above said at least one emitter tip structure;

forming a conductive layer of one or more layers of one or more electrically conductive materials on or above said insulative layer, said conductive layer having a surface exhibiting topographical variations at least partially corresponding to a location of said at least one emitter tip structure; and bombarding said surface with ions to selectively remove material from said conductive layer at least in part by momentum transfer at least partially responsive to said topographical variation for removing a portion of said conductive layer in near proximity to said at least one emitter tip structure more rapidly than another portion of said conductive layer more remote from said at least one emitter tip structure.

10. The method of claim 9, wherein said bombarding comprises ion milling.

11. A method for forming an extraction grid for a field emission display, comprising: providing a substantially planar substrate assembly;

providing a plurality of emitter tip structures on said substrate assembly;

providing a chamber;

locating and sealing said substrate assembly in said chamber;

without unsealing said chamber, forming said extraction grid by forming an insulative layer of one or more dielectric materials on or above said plurality of emitter tip structures;

forming a conductive layer of one or more electrically conductive materials on or above said insulative layer, said conductive layer having a surface exhibiting topographical variations at least partially corresponding to locations of said plurality of emitter tip structures; and bombarding said surface with ions to selectively remove material from said conductive layer at least in part by momentum transfer at least partially responsive to said topographical variation for removing a portion of said conductive layer in near proximity to said plurality of emitter tip structures more rapidly than another portion of said conductive layer more remote from said plurality of emitter tip structures.

12. The method of claim 11, wherein said bombarding comprises ion milling.

13. A method for forming an extraction grid for a field emission display, comprising:

providing a substantially planar substrate assembly;

providing a plurality of emitter tip structures on said substrate assembly;

providing a cluster;

locating and sealing said substrate assembly in said cluster;

forming said extraction grid in situ in said cluster by forming an insulative layer of one or more dielectric materials on or above said plurality of emitter tip structures;

forming a conductive layer of one or more electrically conductive materials on or above said insulative layer, said conductive layer having a surface exhibiting topographical variations at least partially corresponding to locations of said plurality of emitter tip structures; and bombarding said surface with ions to selectively remove material from said conductive layer at least in part by momentum transfer at least partially responsive to said topographical variation to remove a portion of said conductive layer in near proximity to said plurality of emitter tip structures more rapidly than another portion of said conductive layer more remote from said plurality of emitter tip structures.

14. The method of claim 13, wherein said bombarding comprises ion milling.

15. A process for providing an extraction grid, comprising:

providing a substrate assembly including emitter tip structures, said emitter tip structures defining at least one valley therebetween;

depositing an insulative layer on said emitter tip structures and in said at least one valley;

depositing a conductive layer on said insulative layer, said conductive layer having a surface with topographical variations at least partially corresponding to location of said emitter tip structures; and selectively removing material from said conductive layer by ion milling responsive to said topographical variation to expose portions of said insulative layer in near proximity to, and self-aligned with, apexes of said emitter tip structures while leaving material of said conductive layer in said at least one valley, said extraction grid being defined at least in part by at least a portion of said conductive layer remaining in said at least one valley after said selective removal.

16. The process of claim 15, wherein said ion milling uses ions from an inert gas.

17. The process of claim 16, wherein said inert gas is argon.

18. The process of claim 17, wherein depositing said conductive layer comprises depositing amorphous silicon.

19. A method for forming an extraction grid, comprising:

providing a substrate assembly including at least one emitter tip structure;

vapor depositing an insulative layer of one or more layers of one or more dielectric materials on or above said at least one emitter tip structure;

vapor depositing a conductive layer of one or more layers of one or more electrically conductive materials on or above said insulative layer, said conductive layer having a surface exhibiting topographical variation at least partially responsive to a location of said at least one emitter tip structure; and ion milling said surface to selectively remove material from said conductive layer at least partially responsive to said topographical variation to remove said conductive layer in near proximity to said at least one emitter tip structure more rapidly than said conductive layer more remote from said at least one emitter tip structure.

20. The method of claim 19, wherein said ion milling uses ions from an inert gas, said inert gas with a voltage at or in excess of 100 volts.

* * * * *